(12) United States Patent
Paleari et al.

(10) Patent No.: US 10,483,220 B2
(45) Date of Patent: Nov. 19, 2019

(54) METHOD OF MANUFACTURING SEMICONDUCTOR DEVICES AND CORRESPONDING DEVICE

(71) Applicant: STMICROELECTRONICS S.R.L., Agrate Brianza (IT)

(72) Inventors: Andrea Paleari, Brugherio (IT); Antonella Milani, Cusano Milanino (IT); Lucrezia Guarino, Milan (IT); Federica Ronchi, Bellusco (IT)

(73) Assignee: STIMICROELECTRONICS S.R.L., Agrate Brianza (IT)

( * ) Notice: Subject to any disclaimer, the term of this patent is extended or adjusted under 35 U.S.C. 154(b) by 0 days.

(21) Appl. No.: 15/239,545

(22) Filed: Aug. 17, 2016

(65) Prior Publication Data
US 2017/0221840 A1 Aug. 3, 2017

(30) Foreign Application Priority Data

Feb. 1, 2016 (IT) ........................ 102016000010009

(51) Int. Cl.
*H01L 23/00* (2006.01)
*H01L 21/768* (2006.01)
(Continued)

(52) U.S. Cl.
CPC ........ *H01L 24/02* (2013.01); *H01L 21/76852* (2013.01); *H01L 21/76885* (2013.01);
(Continued)

(58) Field of Classification Search
None
See application file for complete search history.

(56) References Cited

U.S. PATENT DOCUMENTS 5,223,454 A * 6/1993 Uda ..................... H01L 23/3121
148/DIG. 100
5,937,320 A * 8/1999 Andricacos ............. H01L 24/03
257/E23.021
(Continued)

FOREIGN PATENT DOCUMENTS

CN 102709263 A 10/2012
CN 103165481 A 6/2013
(Continued)

OTHER PUBLICATIONS

Chinese Office Action and Search Report, dated Oct. 25, 2018, for Chinese Application No. 201610997016.3, 18 pages. (with English Machine Translation).

*Primary Examiner* — Walter H Swanson
*Assistant Examiner* — Kien C Ly
(74) *Attorney, Agent, or Firm* — Seed IP Law Group LLP

(57) ABSTRACT

In one embodiment, a method manufactures a semiconductor device including metallizations having peripheral portions with one or more underlying layers having marginal regions extending facing the peripheral portions. The method includes: providing a sacrificial layer to cover the marginal regions of the underlying layer, providing the metallizations while the marginal regions of the underlying layer are covered by the sacrificial layer, and removing the sacrificial layer so that the marginal regions of the underlying layer extend facing the peripheral portions in the absence of contact interface therebetween, thereby avoiding thermo-mechanical stresses.

19 Claims, 19 Drawing Sheets

(51) Int. Cl.
*H01L 23/525* (2006.01)
*H01L 23/528* (2006.01)
*H01L 23/532* (2006.01)

(52) U.S. Cl.
CPC ........ *H01L 23/525* (2013.01); *H01L 23/5283* (2013.01); *H01L 23/53238* (2013.01); *H01L 24/00* (2013.01); *H01L 2224/024* (2013.01); *H01L 2224/0219* (2013.01); *H01L 2224/0239* (2013.01); *H01L 2224/02181* (2013.01); *H01L 2224/02315* (2013.01); *H01L 2224/02333* (2013.01); *H01L 2224/02372* (2013.01); *H01L 2924/01022* (2013.01); *H01L 2924/01029* (2013.01); *H01L 2924/01074* (2013.01); *H01L 2924/05042* (2013.01); *H01L 2924/351* (2013.01)

(56) References Cited

U.S. PATENT DOCUMENTS

| | | | | |
|---|---|---|---|---|
| 6,228,759 | B1 * | 5/2001 | Wang | H01L 21/2855 |
| | | | | 257/E21.169 |
| 6,528,412 | B1 * | 3/2003 | Wang | H01L 21/76826 |
| | | | | 257/E21.576 |
| 6,756,294 | B1 | 6/2004 | Chen et al. | |
| 8,298,930 | B2 * | 10/2012 | Arvin | H01L 24/11 |
| | | | | 257/751 |
| 8,476,762 | B2 | 7/2013 | Daubenspeck et al. | |
| 8,809,951 | B2 * | 8/2014 | Lin | H01L 23/642 |
| | | | | 257/335 |
| 8,884,418 | B2 * | 11/2014 | Camacho | H01L 21/568 |
| | | | | 257/686 |
| 9,224,686 | B1 * | 12/2015 | Chen | H01L 21/76855 |
| 2005/0116340 | A1 * | 6/2005 | Shindo | H01L 24/03 |
| | | | | 257/737 |
| 2005/0215045 | A1 | 9/2005 | Rinne et al. | |
| 2007/0023919 | A1 * | 2/2007 | Lin | H01L 24/11 |
| | | | | 257/774 |
| 2009/0102032 | A1 * | 4/2009 | Schneegans | H01L 23/53238 |
| | | | | 257/676 |
| 2010/0109159 | A1 * | 5/2010 | Ho | H01L 24/11 |
| | | | | 257/737 |
| 2010/0171219 | A1 * | 7/2010 | Moreau | H01L 21/76834 |
| | | | | 257/751 |
| 2011/0147932 | A1 * | 6/2011 | Trezza | H01L 21/6835 |
| | | | | 257/739 |
| 2012/0064712 | A1 | 3/2012 | Lei et al. | |
| 2012/0129335 | A1 * | 5/2012 | Ikumo | H01L 23/3192 |
| | | | | 438/614 |
| 2014/0001615 | A1 * | 1/2014 | Otremba | H01L 23/3107 |
| | | | | 257/676 |
| 2014/0361431 | A1 * | 12/2014 | Matsumoto | H01L 24/11 |
| | | | | 257/737 |
| 2016/0276237 | A1 * | 9/2016 | Lin | H01L 23/49816 |
| 2016/0300804 | A1 * | 10/2016 | Omori | H01L 21/76855 |
| 2017/0053872 | A1 * | 2/2017 | Lee | H01L 23/5384 |
| 2017/0098627 | A1 * | 4/2017 | Das | H01L 25/0657 |

FOREIGN PATENT DOCUMENTS

| | | |
|---|---|---|
| JP | 63-249346 A | 10/1988 |
| JP | 2009-231681 A | 10/2009 |
| JP | 2013165099 A | 8/2013 |
| WO | 98/52224 A1 | 11/1998 |

* cited by examiner

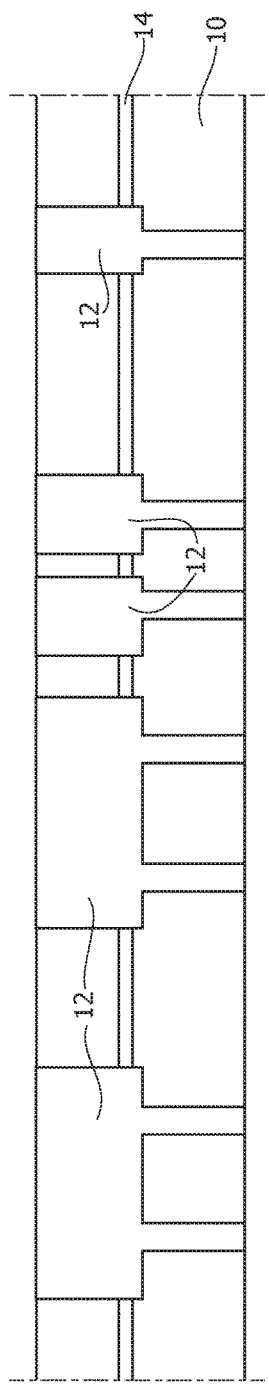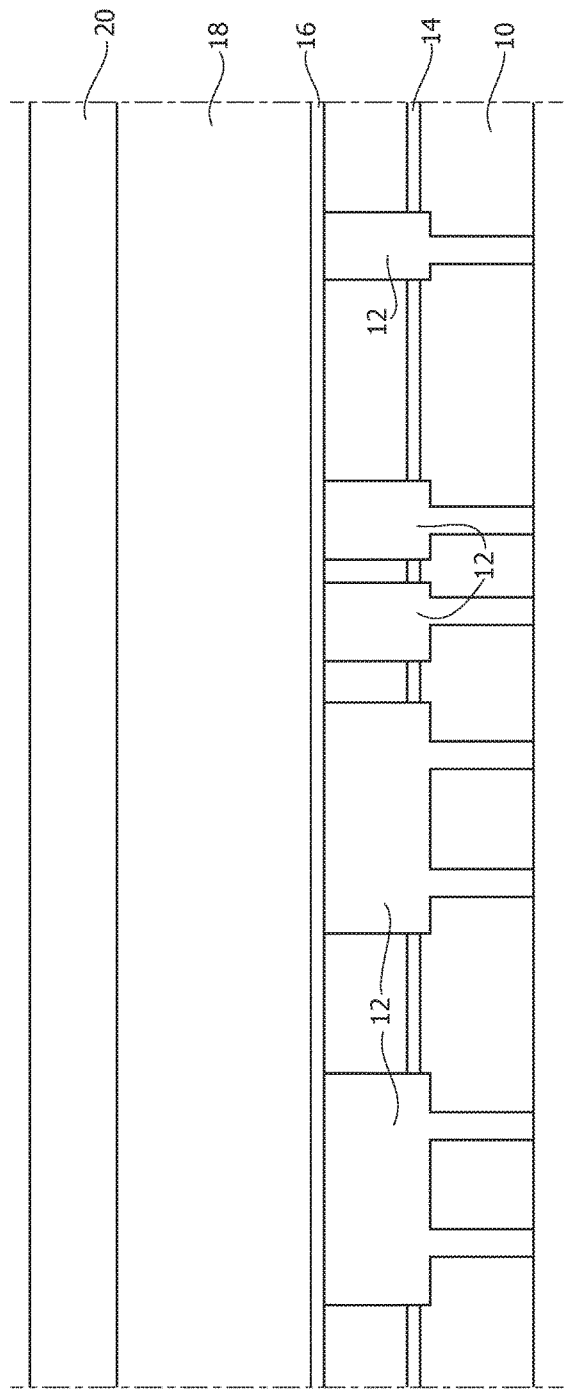

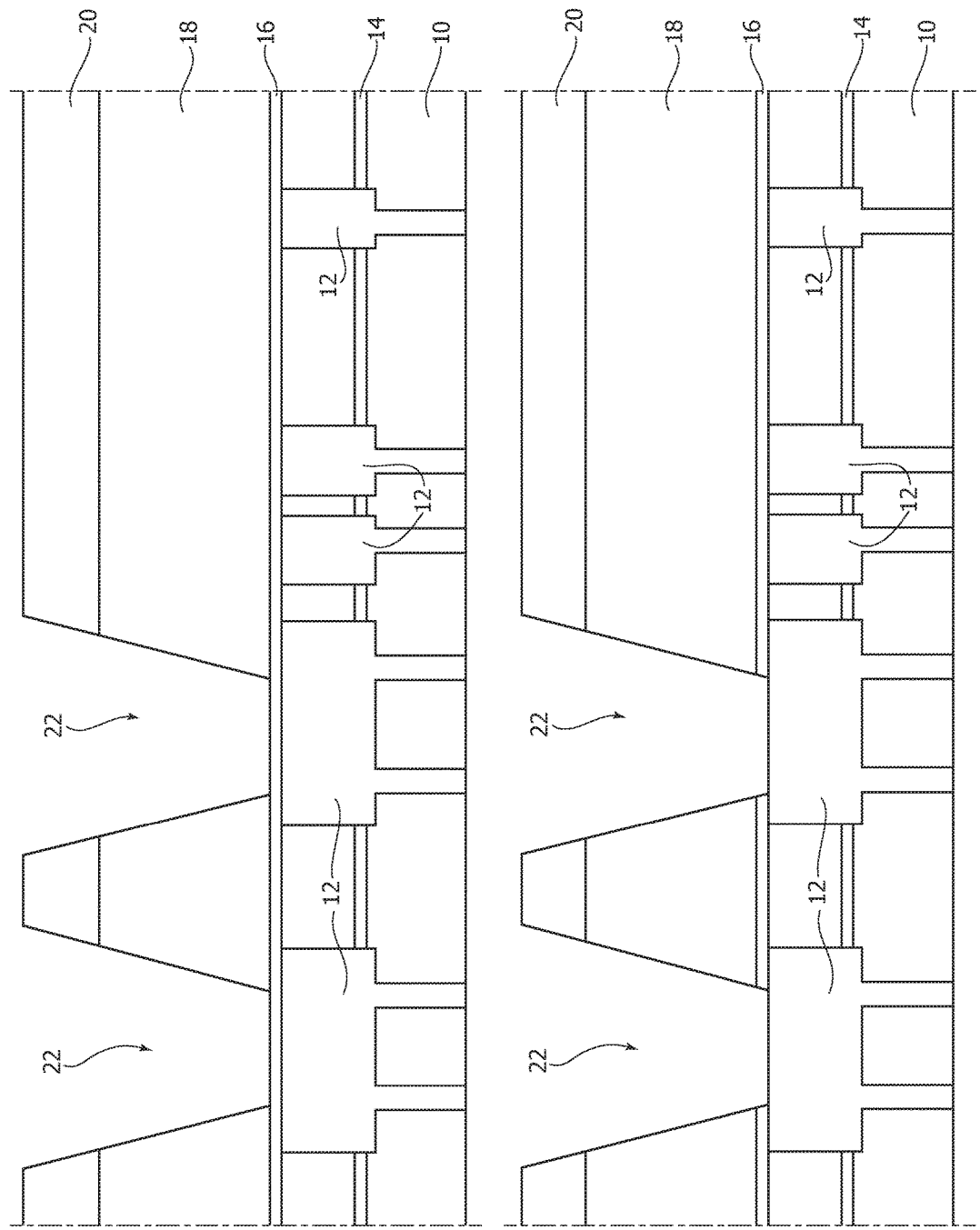

US 10,483,220 B2

METHOD OF MANUFACTURING SEMICONDUCTOR DEVICES AND CORRESPONDING DEVICE

BACKGROUND

Technical Field

The description relates to manufacturing semiconductor devices.

One or more embodiments may apply, e.g., to thermomechanical stress reduction in integrated circuits, e.g., for automotive and consumer products.

Description of the Related Art

Various types of integrated circuits (ICs) may adopt technologies such as BCD (Bipolar-CMOS-DMOS) technology.

BCD technology may be advantageously used, e.g., for producing integrated circuits with both power electronics and logical control electronics. BCD technology provides a family of silicon processes, each of which combines the strengths of three different process technologies onto a single chip: bipolar for precise analog functions, CMOS (Complementary Metal Oxide Semiconductor) for digital design and DMOS (Double Diffused Metal Oxide Semiconductor) for power and high-voltage elements.

Implementing BCD technology may involve top layer copper metal interconnections, called a re-distribution layer (RDL).

Resistance of passivation and intermediate insulating layers against reliability issues, as caused, e.g., by thermo-elastic coupling and stresses during wire bonding and packaging processes, may represent factors deserving attention.

Silicon nitride (SiN) or silicon carbide (SiC) may be used in manufacturing ICs to provide a passivation layer for microchips, e.g., to provide a barrier against water molecules and other sources of corrosion and instability in microelectronics.

In structure corners of metallizations such as Cu (copper) RDL top metallizations, stresses may arise due to thermo-mechanical mismatch between different materials, e.g., barrier layer (titanium-tungsten (TiW), tantalum (Ta), tantalum nitride (TaN)), metallization capping layer (nickel-palladium (Ni—Pd), nickel-palladium-gold (Ni—Pd—Au), nickel-gold (Ni—Au)), passivation layer (SiN, SiC) triple point).

BRIEF SUMMARY

One or more embodiments is to contribute to overcoming passivation stress in the passivation layer upper surface at the edge (e.g., at a corner) of a Cu RDL structure.

According to one or more embodiments, that object may be achieved by means of a method having the features set forth in the claims that follow.

One or more embodiments may also relate to a corresponding device.

The claims are an integral part of the technical disclosure of one or more embodiments has provided herein.

One or more embodiments may lead to SiN passivation stress reduction by dispensing with a "triple point", e.g., by decoupling a capping-barrier (e.g., nickel-TiW) interface from top surface of the passivation layer (e.g., SiN, SiC).

One or more embodiments may involve a modification of a, e.g., Cu RDL process flow including adding a sacrificial insulating layer to create a gap between the passivation layer and, e.g., nickel.

In one or more embodiments an increased passivation robustness may be achieved by means of a process flow which may maintain full copper (Cu) coverage by nickel (Ni) to prevent copper migration without changes of materials and related interfaces.

One or more embodiments may include a double barrier layer (e.g., TiW) adapted to decouple nickel and the passivation layer by avoiding the presence of a "triple point" responsible for critical stress of the passivation layer.

One or more embodiments may include a double copper barrier deposition, a gap between nickel and the passivation layer, with no nickel growth on a copper barrier in contact with the passivation layer.

One or more embodiments may dispense with a TiW—Ni—SiN passivation interface, with Cu fully encapsulated, e.g., in TiW and Ni (to avoid Cu migration and corrosion) and no undercuts after last barrier etch.

BRIEF DESCRIPTION OF THE SEVERAL VIEWS OF THE FIGURES

One or more embodiments will now be described, purely by way of example, with reference to the annexed figures, in which:

FIGS. 1 to 15 are exemplary of possible steps in one or more embodiments,

Figure 5:
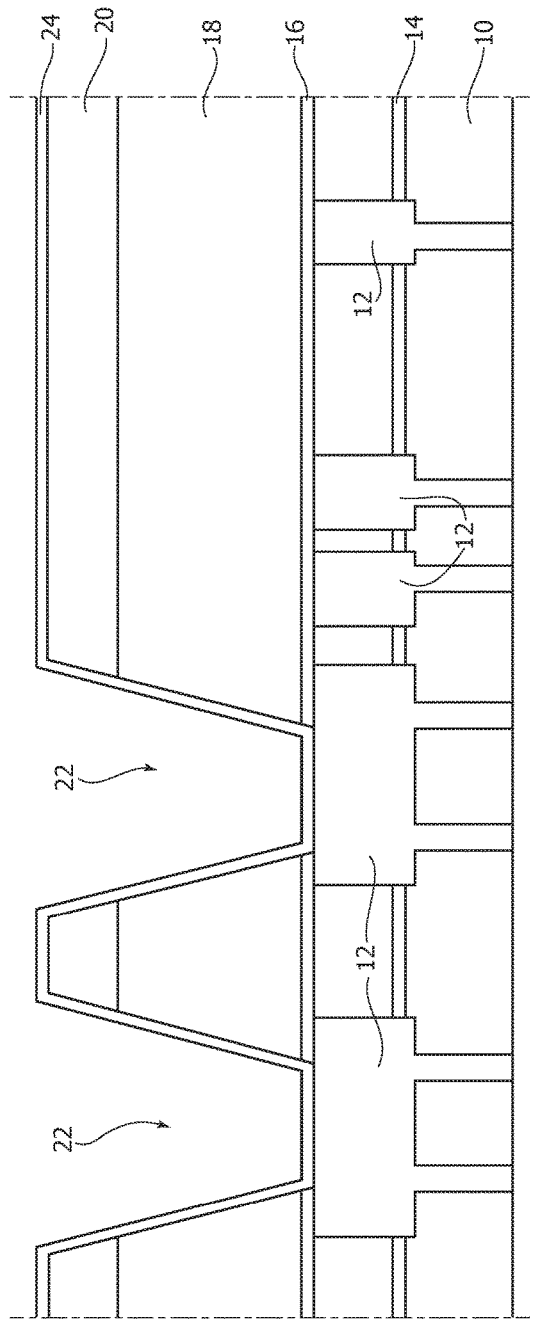

It will be appreciated that for the sake of clarity of representation certain features of the figures (e.g., layer thicknesses) may not be drawn to a same scale.

DETAILED DESCRIPTION

In the ensuing description, one or more specific details are illustrated, aimed at providing an in-depth understanding of examples of embodiments. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the extent of protection or the scope of the embodiments.

Stress reduction in semiconductor devices such as, e.g., integrated circuits (ICs) represents an extensive area of technical investigation.

U.S. Pat. No. 8,476,762 is exemplary of related activity. That document discloses a method of manufacturing a lead-free Controlled Collapse Chip Connection (C4) with a Ball Limiting Metallurgy (BLM) structure for semiconductor chip packaging that reduce chip-level cracking during the Back End of Line (BEOL) processes of chip-join cool-down. An edge of the BLM structure that is subject to tensile stress during chip-join cool down is protected from undercut of a metal seed layer, caused by wet etch of the chip to remove metal layers from the chip's surface and solder reflow, by an electroplated barrier layer, which covers a corresponding edge of the metal seed layer.

FIGS. 1 to 5 are exemplary of possible steps in a RDL (Re-Distribution Layer) process.

In one or more embodiments, the steps exemplified in FIGS. 1 to 5 may include:
Cu chemical mechanical polishing (Cu CMP) of a dielectric substrate 10 wherein electrically conductive (e.g., copper) formations 12 are provided with a dielectric landing (e.g., SiN) layer 14 (FIG. 1);
deposition of a "capping" silicon nitride layer 16, an inter-layer dielectric layer 18 and a passivation layer 20, e.g., SiN, SiC (FIG. 2);
etching of vias 22 through the passivation layer 20 and the inter-layer dielectric layer 18 landing on (that is down to) the nitride capping layer 16 (FIG. 3).

FIG. 4 is exemplary of a "blanket" opening step of the capping layer 16 causing the vias 22 to land on the conductive formations 12 (e.g., copper), for instance with a via width/space of, e.g., approximately 3 microns ($3 \times 10^{-6}$ m).

Figure 6:
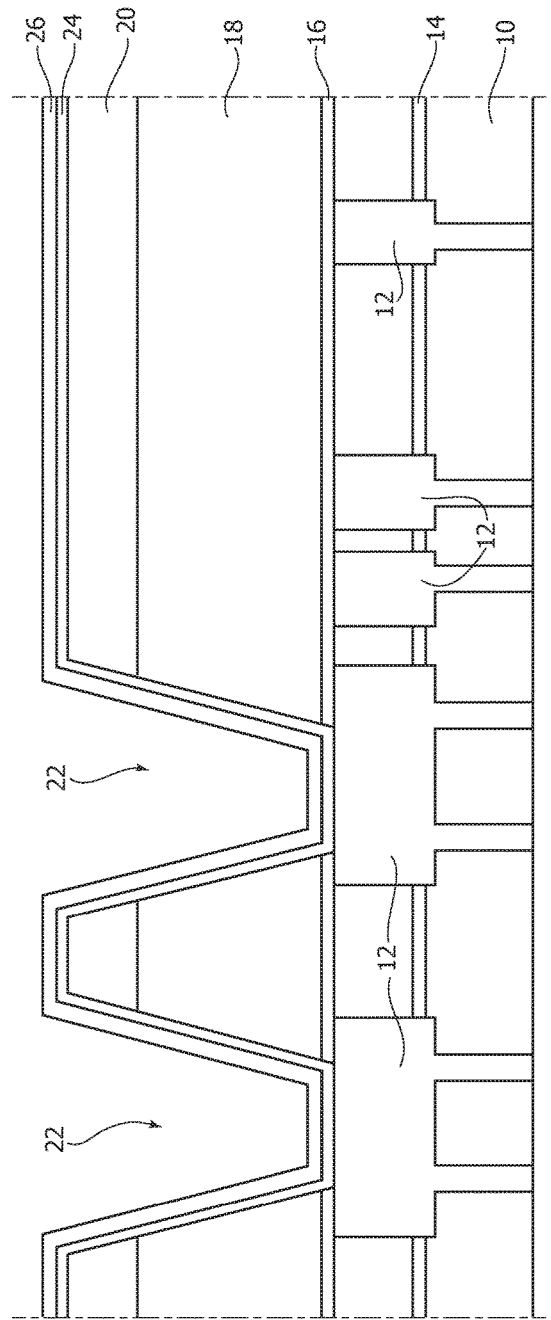

FIG. 5 is exemplary of the formation onto the upper surface of the structure of FIG. 4 of a TiW barrier 24 having a thickness of, e.g., approximately 100 nanometers ($100 \times 10^{-9}$ m), followed (FIG. 6) by the deposition of an at least partly sacrificial dielectric (e.g., SiN) layer 26 having a thickness of, e.g., approximately 100 nanometers ($100 \times 10^{-9}$ m).

Figure 7:
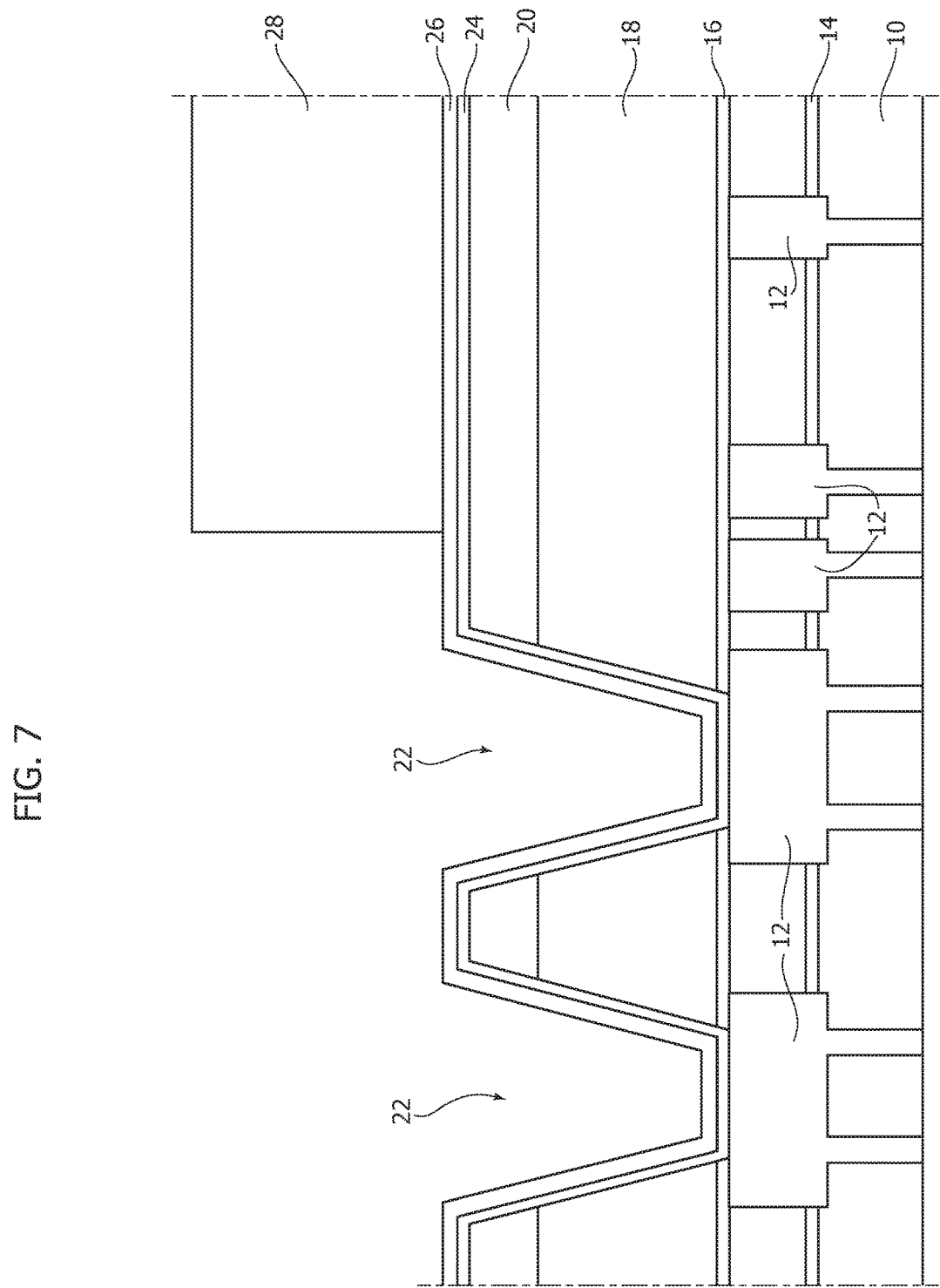
Figure 8:
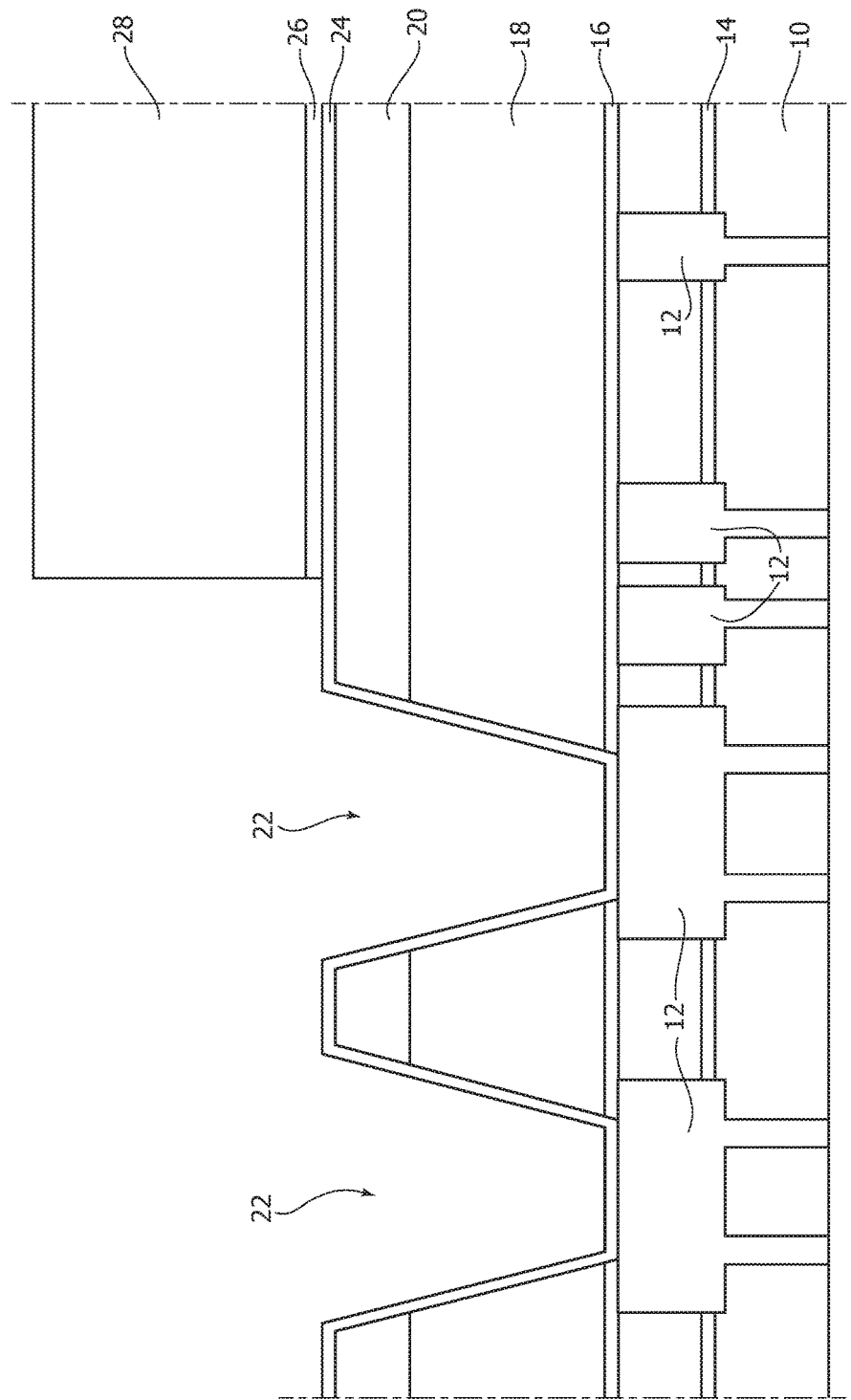

FIG. 7 is exemplary of the provision of a dielectric-RDL mask 28 which covers a marginal region of the underlying dielectric layer 26 and leaves uncovered the area where the vias 22 are provided, followed (FIG. 8) by a nitride etch whereby un-etched dielectric 26 remains (only) under the mask 28.

Figure 9:
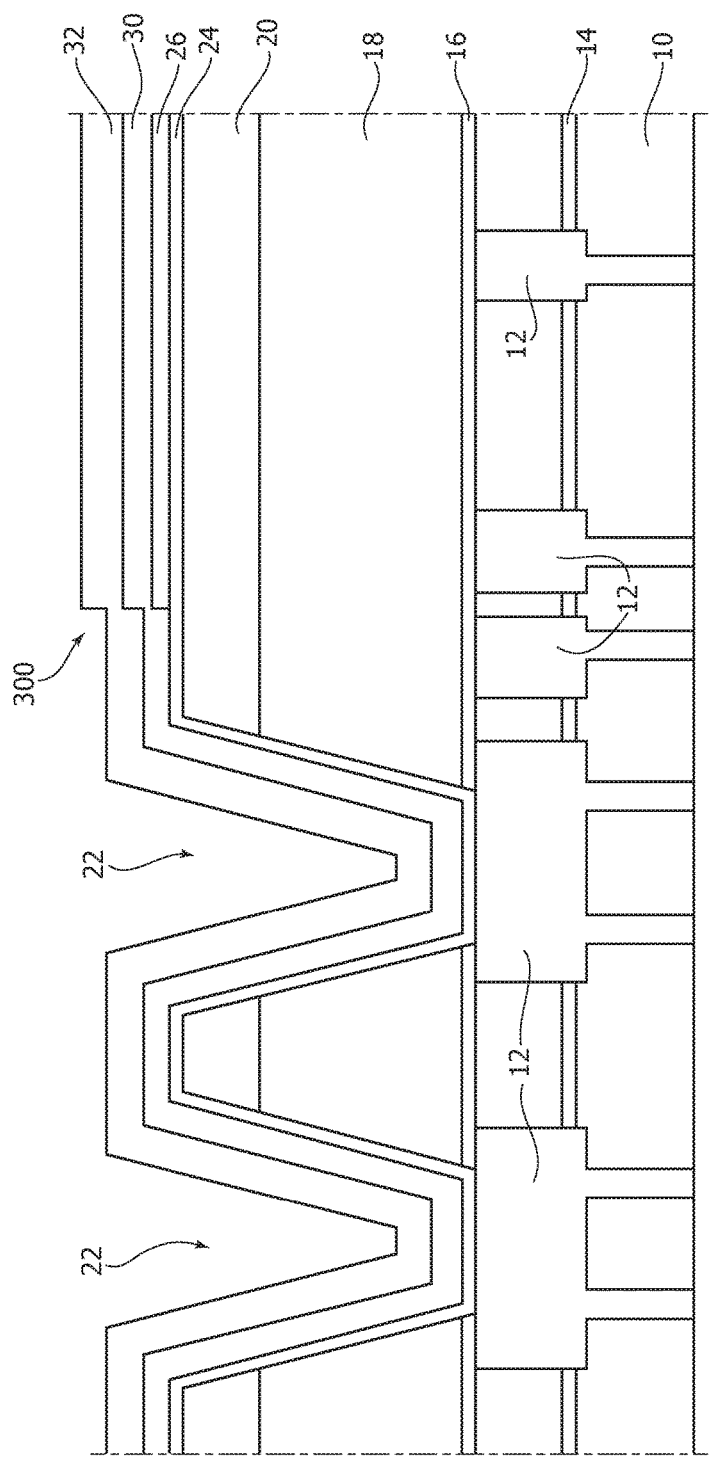

FIG. 9 is exemplary of a step wherein, after removal ("stripping") of the mask 28, a second barrier layer 30 (e.g., TiN—TiW, TiW) of, e.g., approximately 200 nanometers ($200 \times 10^{-9}$ m) is provided followed by the deposition of a, e.g., copper "seed" layer 32 of, e.g., approximately 200 nanometers ($200 \times 10^{-9}$ m).

It will be appreciated that due to the presence of the un-etched nitride 26 remaining under the mask 28, both layers 30 and 32 exhibit a step-like formation at 300.

Figure 10:
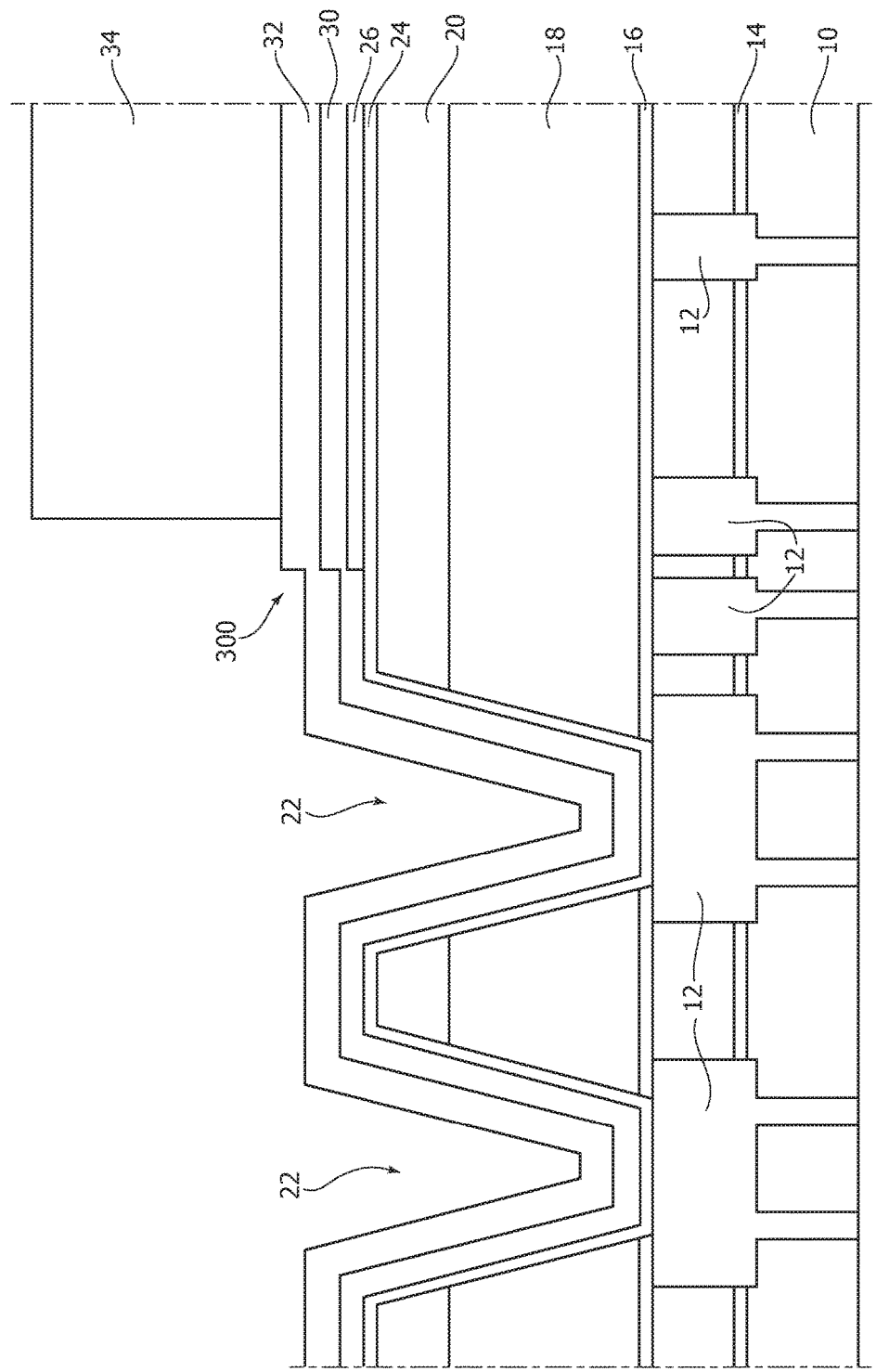

FIG. 10 is exemplary of the provision of a further Cu RDL mask 34 which leaves uncovered the area where the vias 22 are provided, by also leaving uncovered the step-like formation 300.

In one or more embodiments the mask 34 may be laterally offset (recessed), e.g., approximately 1 micron ($1 \times 10^{-6}$ m) with respect to the formation 300.

Figure 11:
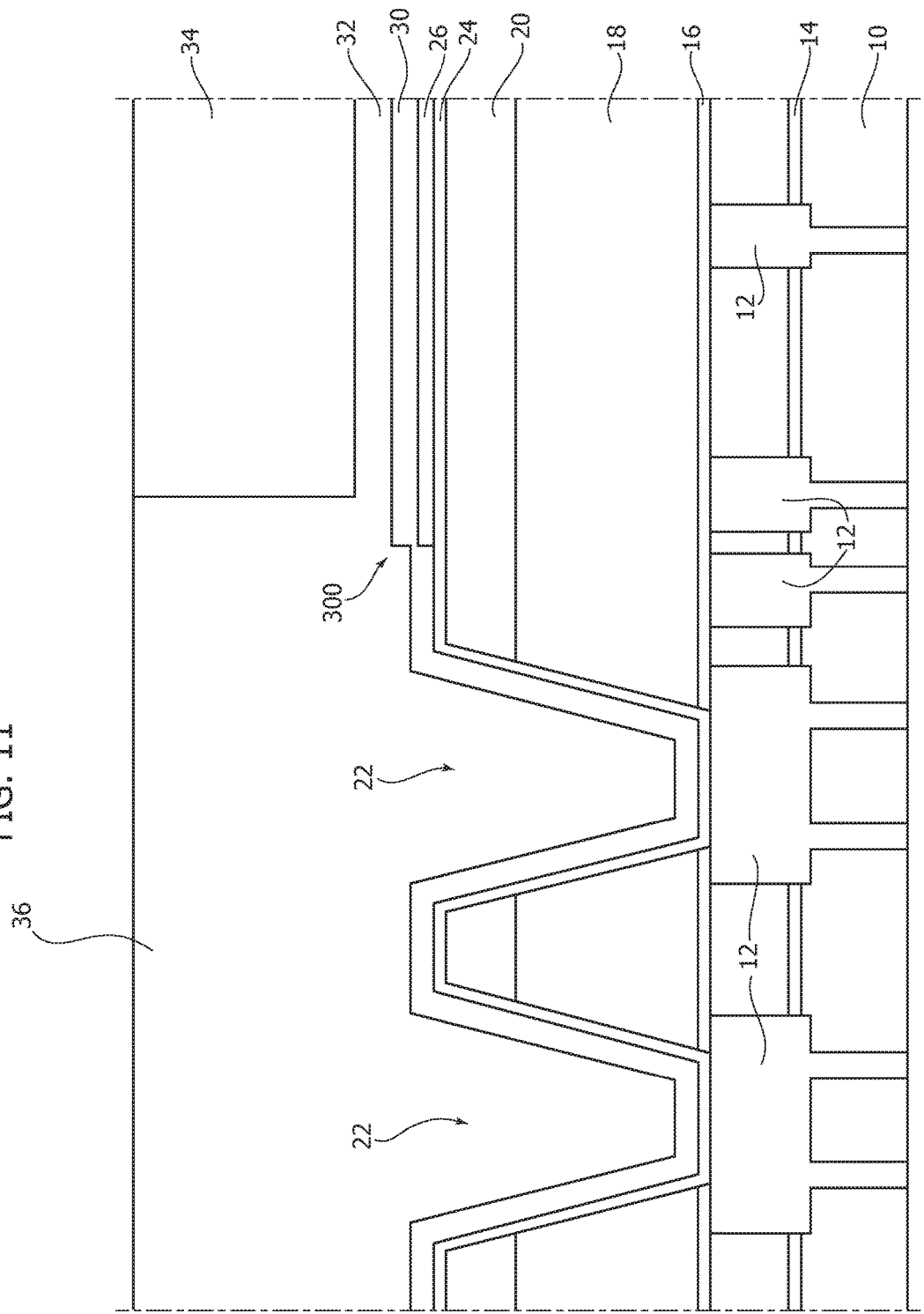

FIG. 11 is exemplary of the formation of a metallization 36, e.g., Cu RDL over the vias 22. In one or more embodiments, the metallization 36 may have a thickness of, e.g., approximately 10 micron ($10 \times 10^{-6}$ m). In one or more embodiments, the metallization 36 may be formed by electrochemical deposition (ECD).

Figure 12:
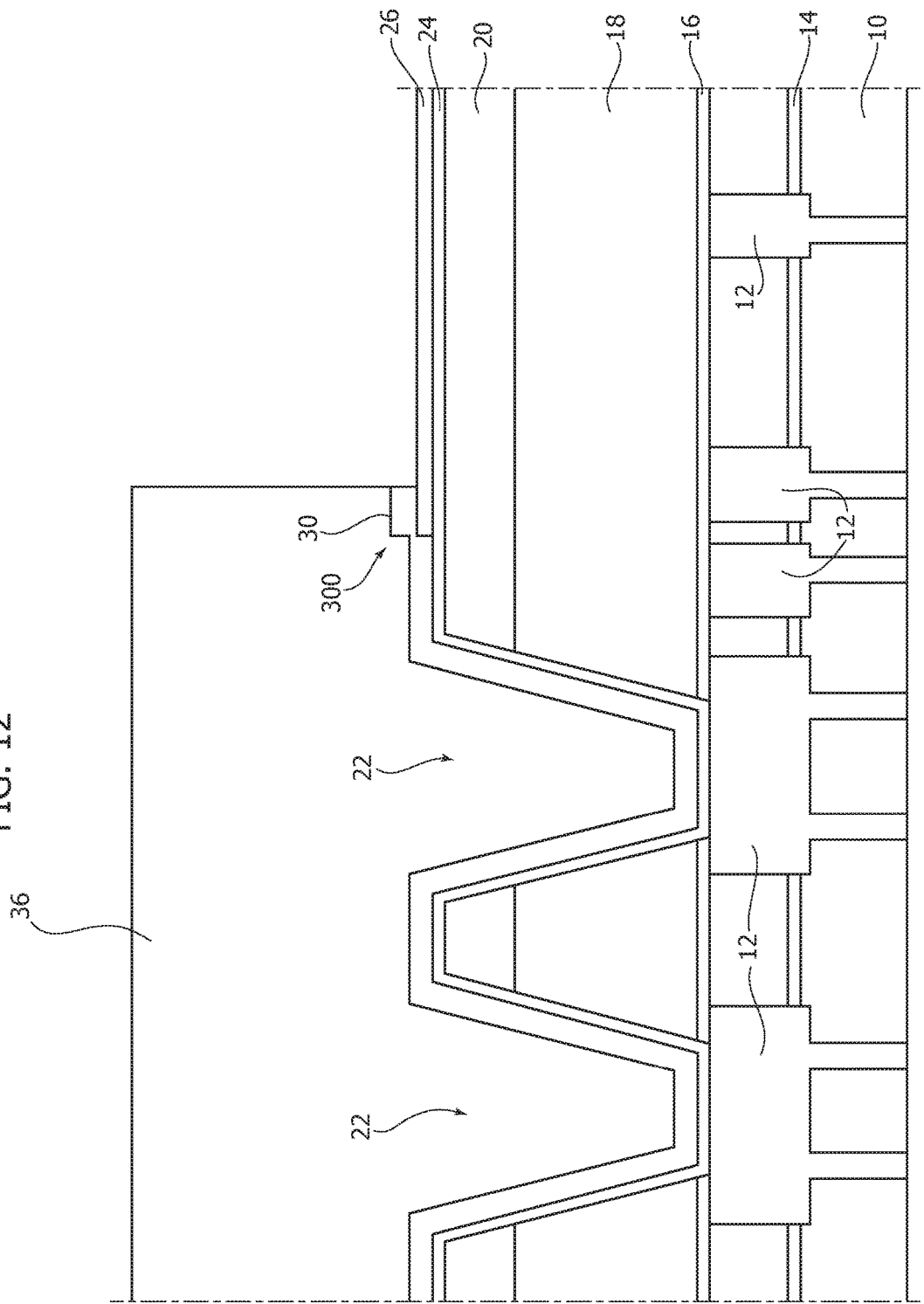

FIG. 12 is exemplary of a step wherein, after removal ("stripping") of the mask 34, the second barrier layer 30 (e.g., TiN—TiW, TiW) and the Cu "seed" layer 32 are removed (e.g., via a wet etch process) from all the surface left uncovered by the metallization 36.

It will be appreciated that, due to the presence of the step-like formation at 300, the TiW layer 30 at the periphery of the metallization 36 is kept at a distance from the TiW barrier 24 by the (so far) un-etched dielectric 26.

Figure 13:
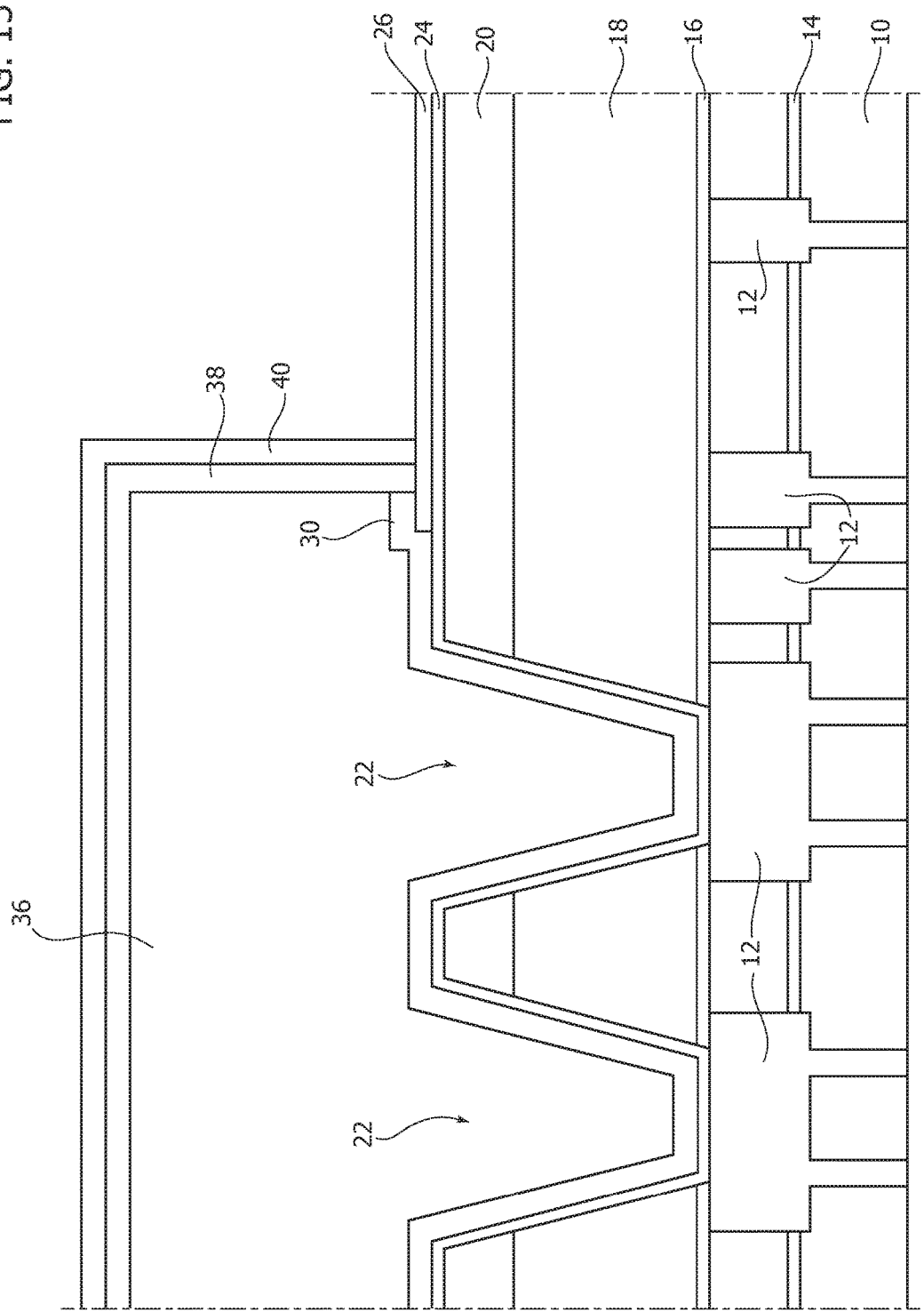

FIG. 13 is exemplary of the deposition of a combined capping layer 38, 40 (e.g., Ni—Pd, Ni—Pd—Au, Ni—Au) on the outer surface of the metallization 36.

In one or more embodiments, the capping layer 38, 40 may have a thickness of, e.g., approximately 2 micron ($2 \times 10^{-6}$ m).

Again, it will be appreciated that, due to presence of the un-etched nitride 26, the capping layer 38, 40 on the outer surface of the metallization 36 is kept at a distance from the first barrier layer 24.

Figure 14:
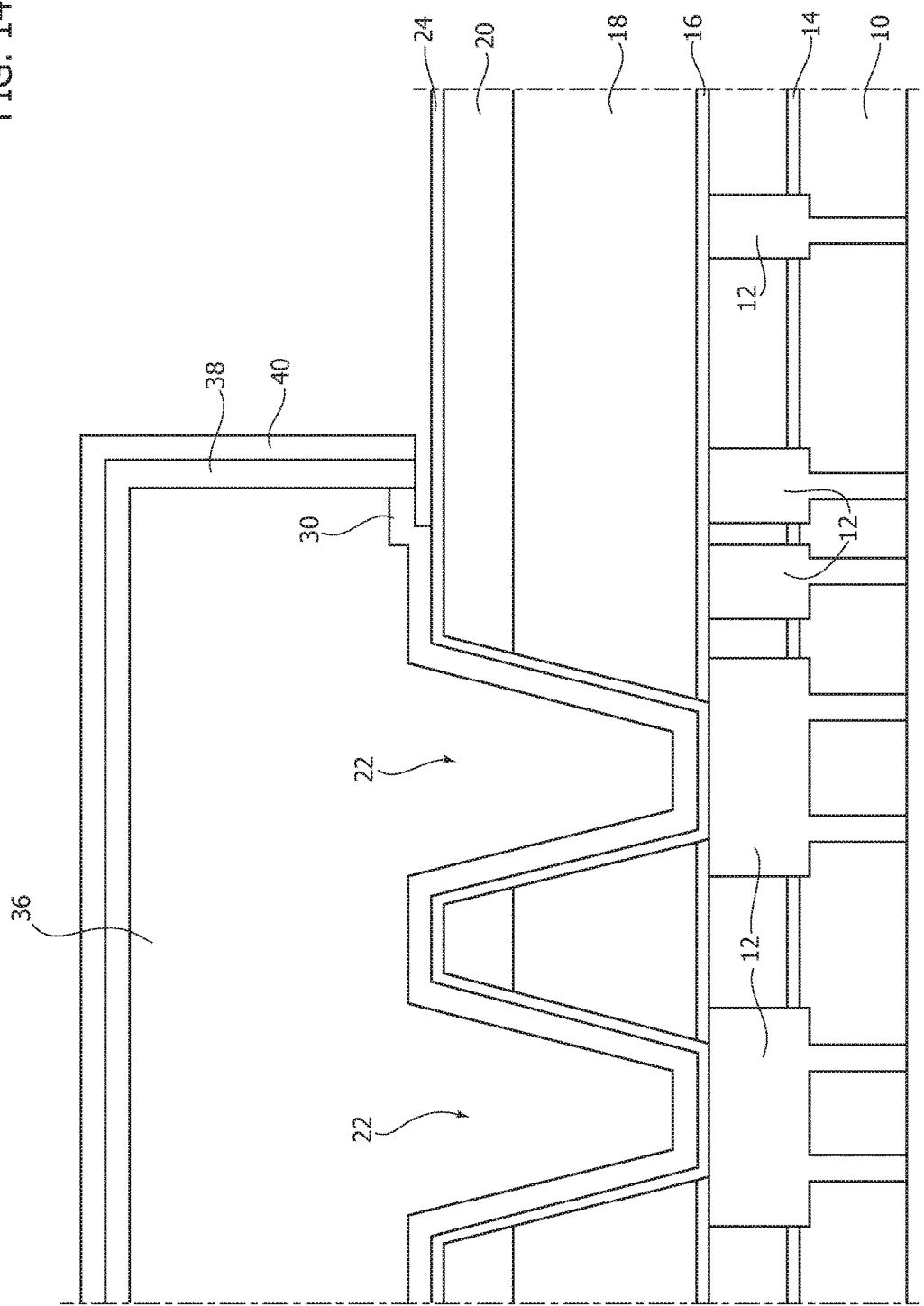
Figure 15:
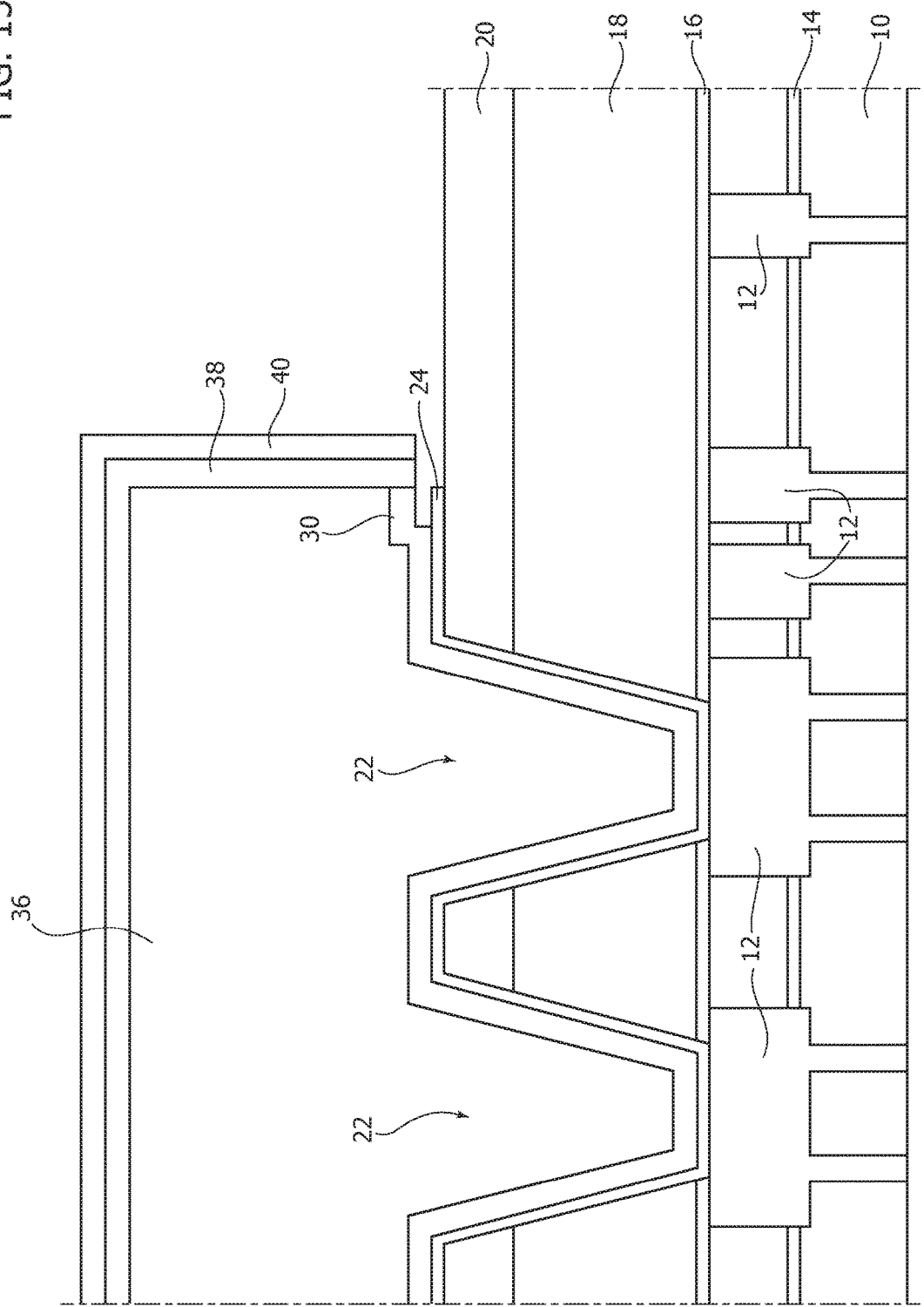
Figure 16:
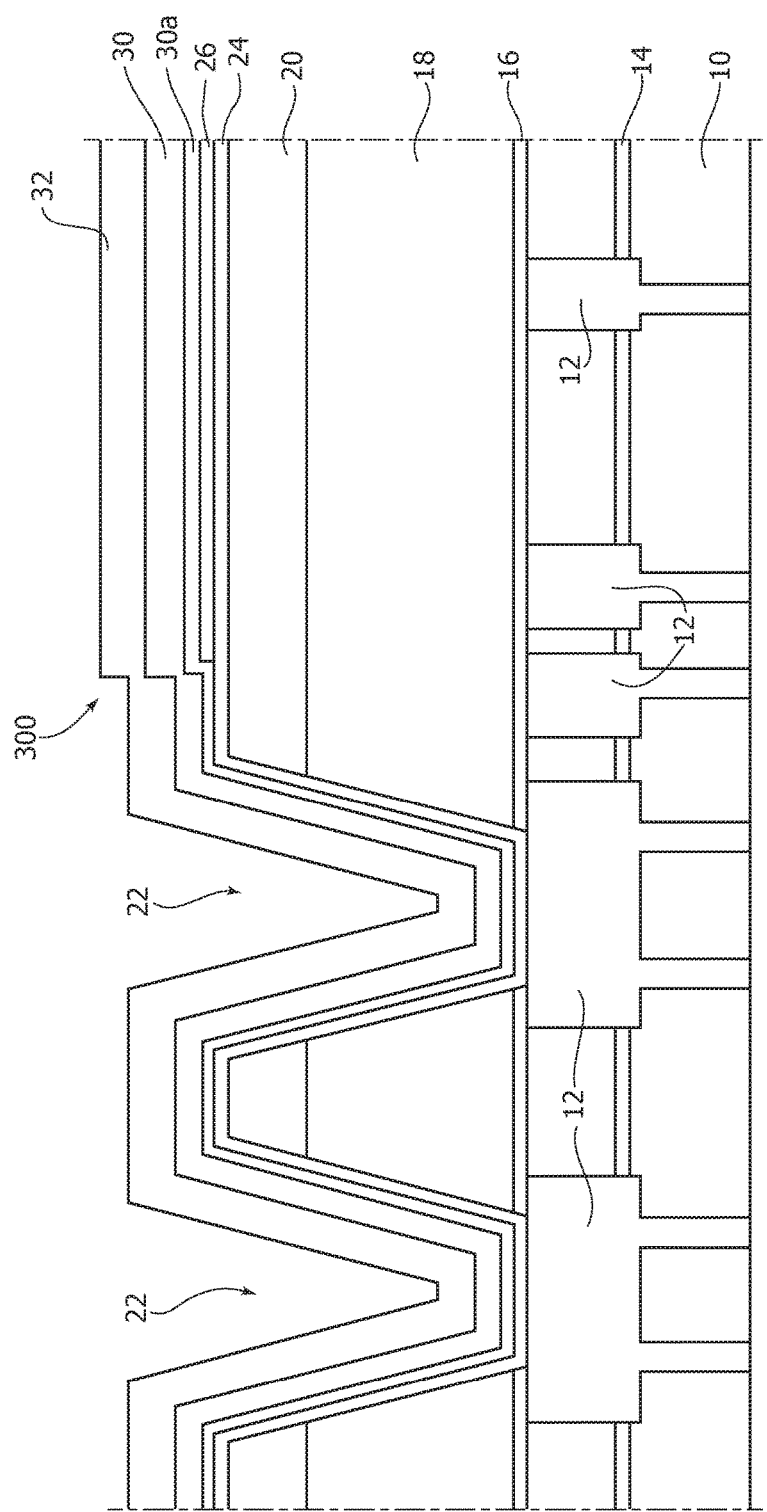
FIGS. 16 to 22 are exemplary of possible modifications of the steps of FIGS. 9 to 15 in one or more embodiments.
Figure 17:
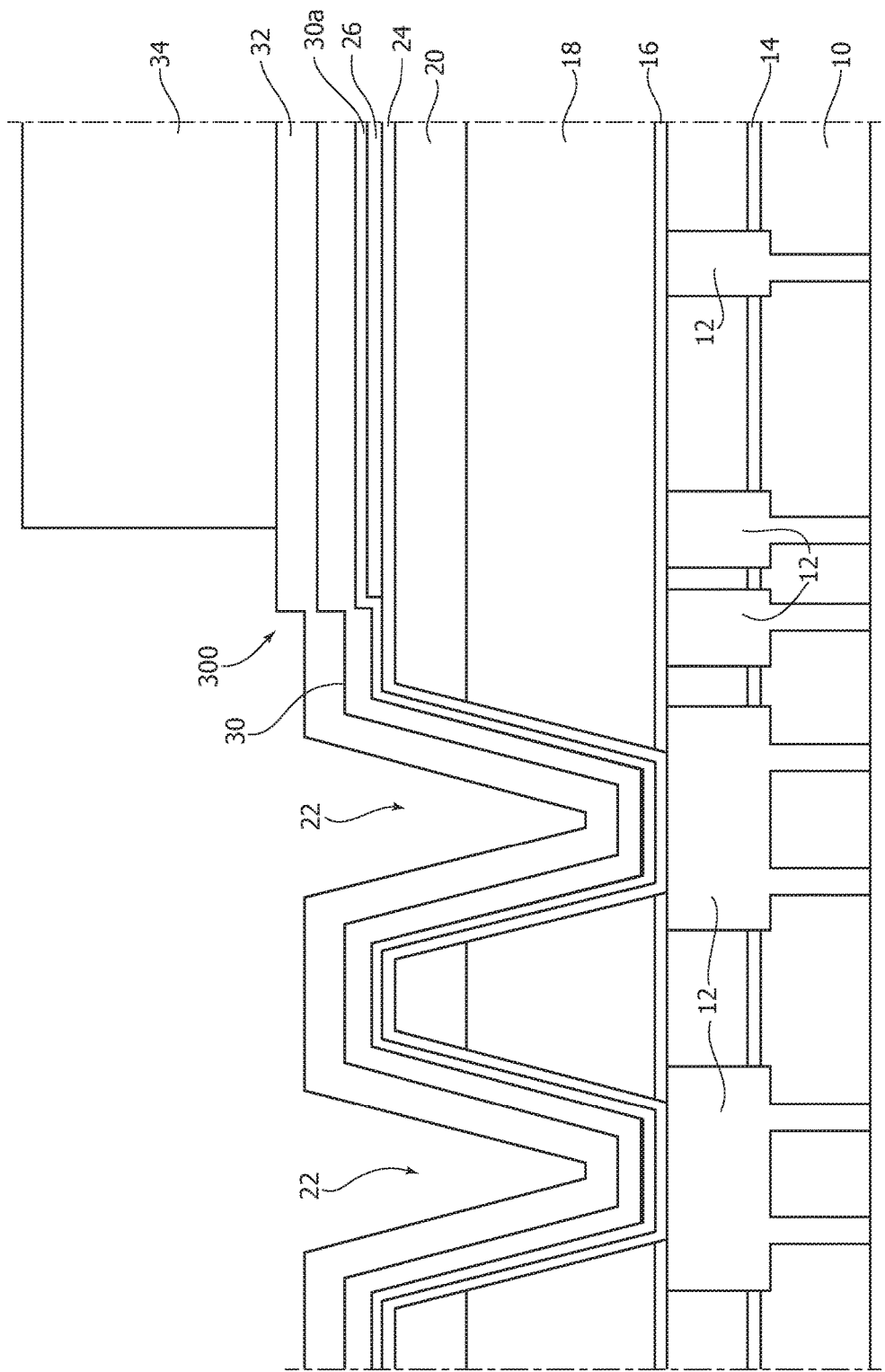
Figure 18:
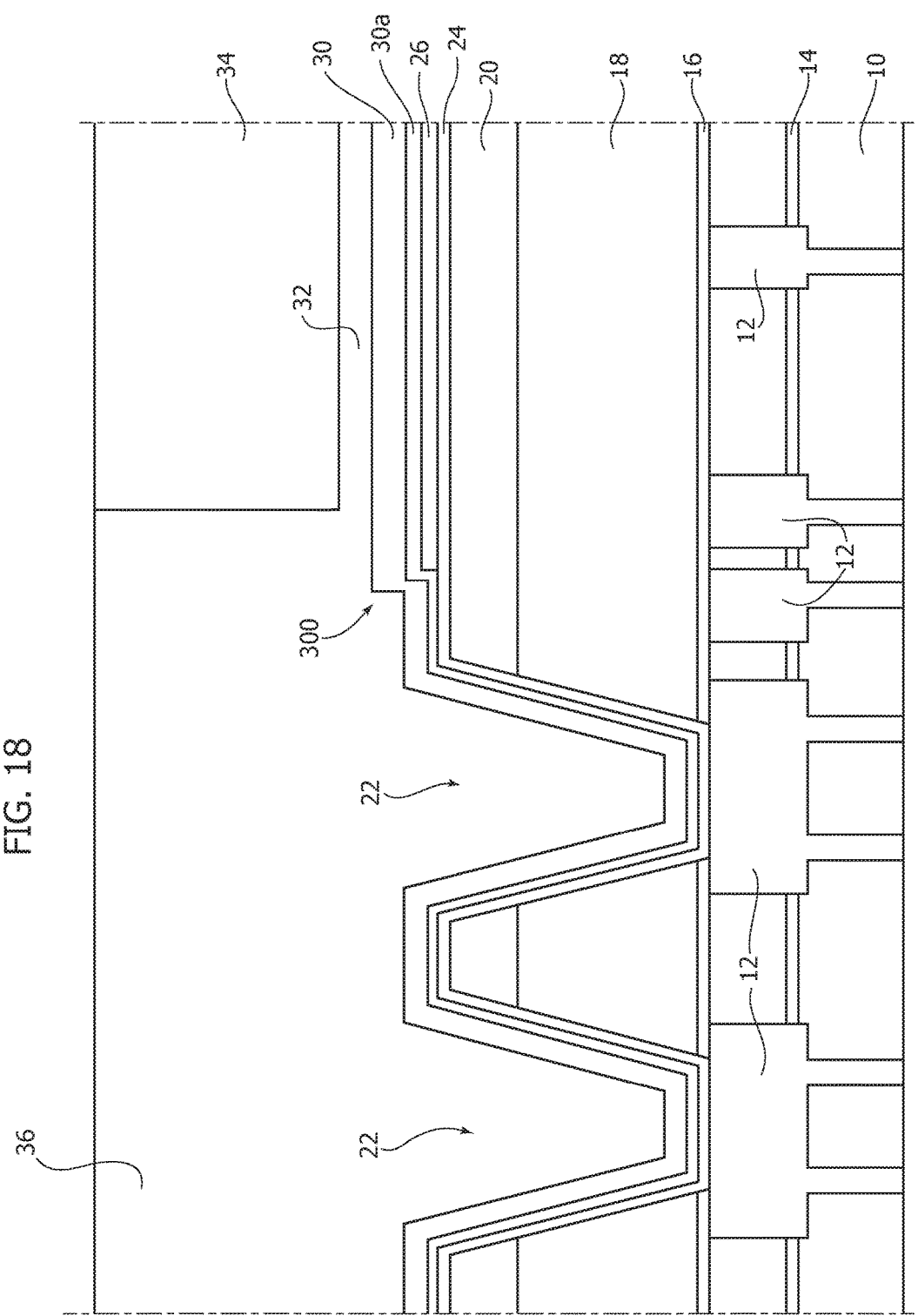

FIG. 14 is exemplary of the removal (e.g., etching) of the nitride 26, and the possible removal (e.g., by etching) of the first barrier 24 extending beyond the periphery of the metallization 36 (FIG. 15).

FIGS. 14 and 15 highlight that the process exemplified herein, and primarily the provision of the sacrificial dielectric layer 26, makes it possible to avoid the formation of a barrier-capping-passivation interface at the periphery of the metallization 36 which may be the source of a high thermo-mechanical stress, with the ensuing drawbacks discussed in the introductory portion of this description.

In one more embodiments as exemplified herein the second barrier layer 30 may contact the capping layer 38 to encapsulate the metallization 36.

FIGS. 16 to 22 are exemplary of embodiments wherein the TiN—TiW deposition of FIG. 9, leading to the formation of the layer 30 (e.g., with an overall thickness of approximately 200 nm, namely $200 \times 10^{-9}$ m), may include the deposition of a TiW layer 30 (e.g., with a thickness of approximately 200 nm, namely $200 \times 10^{-9}$ m) plus a TiN layer 30a (e.g., with a thickness of approximately 10 nm, namely $10 \times 10^{-9}$ m) on the "inner" surface of the layer 30, that is the surface of the layer 30 facing towards the first barrier 24 (and the dielectric layer 26).

Figure 21:
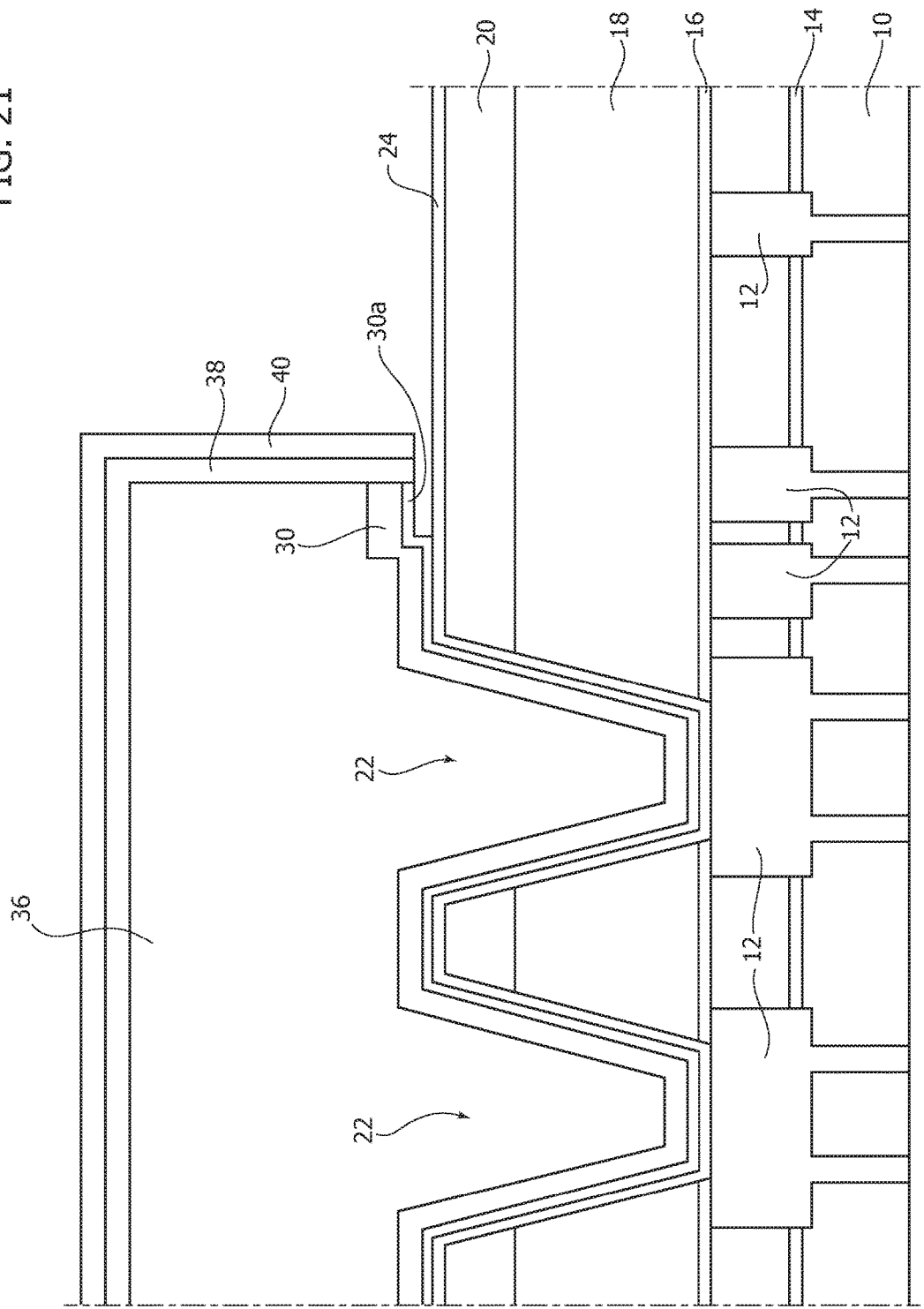
Figure 22:
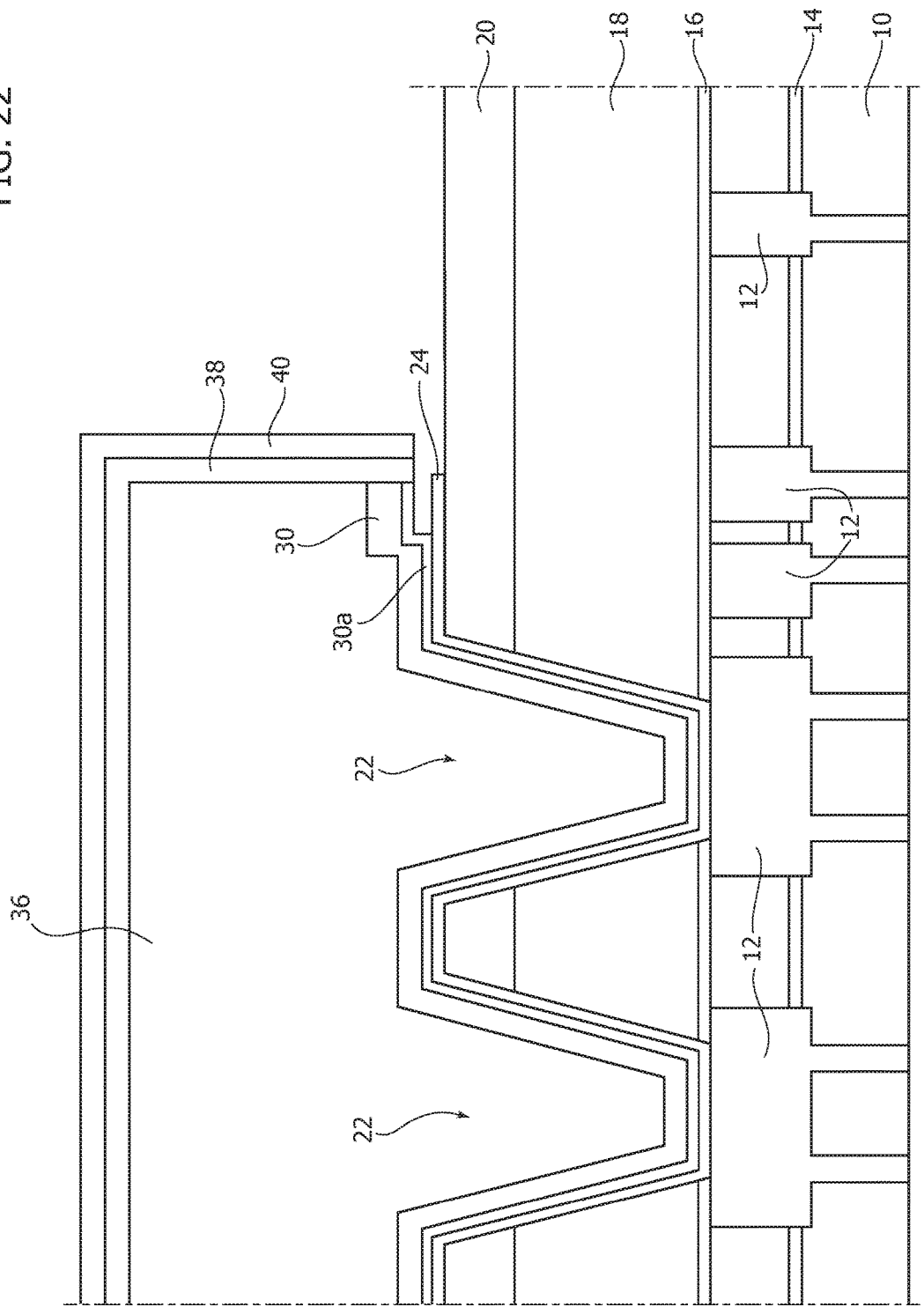

The other process steps exemplified in FIGS. 16 to 22 may be otherwise regarded as corresponding to the process steps exemplified in FIGS. 9 to 15, namely:
deposition of a Cu "seed" layer 32 (FIG. 16);
provision of the further Cu RDL mask 34 which leaves uncovered the area where the vias 22 are provided, by also leaving uncovered the step-like formation 300 (FIG. 17);
formation of the metallization 36, e.g., Cu RDL over the vias 22 (FIG. 18);
removal ("stripping") of the mask 34, removal of the second barrier layer 30 (e.g., TiN—TiW) and the Cu "seed" layer 32 from the surface left uncovered by the metallization 36 (FIG. 19);
deposition of a combined capping layer 38, 40 (e.g., Ni—Pd, Ni—Pd—Au, Ni—Au) on the outer surface of the metallization 36 (FIG. 20);
removal of the dielectric 26, and the possible removal of the first barrier 24 (e.g., by TiW etch selective on Tin) extending beyond the periphery of the metallization 36 (FIGS. 21 and 22).

FIGS. 21 and 22 highlight that the process exemplified herein, and primarily the provision of the sacrificial dielectric layer 26 make it possible to avoid the formation of a barrier-capping-passivation interface at the periphery of the metallization 36.

Again, this avoids the possible formation of a high thermo-mechanical stress, with the ensuing drawbacks discussed in the introductory portion of this description. In one more embodiments as exemplified in FIGS. 16 to 22 the TiN layer 30a may possibly adjoin the capping layer 38 to encapsulate the metallization 36 (with the TiW layer 30 at its bottom surface).

It will be otherwise appreciated that the specific choices of material as exemplified in the foregoing are primarily related to certain process embodiments, e.g., in connections with the RDL process. In one or more embodiments, different implementation options may dictate, e.g., different choices of materials and/or layer thicknesses.

One or more embodiments may thus provide a method of manufacturing semiconductor devices including metallizations (e.g., 36, 38, 40) having peripheral portions with at least one underlying layer (e.g., 20, 24) having marginal regions extending facing said peripheral portions.

In one or more embodiments the method may include:
providing a sacrificial layer (e.g., 26) to cover said marginal regions of said at least one underlying layer,
providing said metallizations while said marginal regions of said at least one underlying layer are covered by said sacrificial layer, and
removing said sacrificial layer whereby said marginal regions of said at least one underlying layer extend facing said peripheral portions in the absence of contact interface therebetween.

In one or more embodiments the metallizations may include:
a metallization body (e.g., 36), preferably including copper, and
an outer surface coating or "capping" (e.g., 38, 40) of said body, said coating preferably including at least one of a nickel layer and a palladium layer, wherein said marginal regions extend facing said peripheral portions in the absence of contact interface with both said metallization body and said outer surface coating.

One or more embodiments may include providing a barrier layer (e.g., 30, 30a), preferably including TiN and TiW, underlying said metallization body (36) and adjoining said outer surface coating to provide full coverage of said metallization body, wherein said barrier layer (e.g., 30, 30a) is provided (see, e.g., FIGS. 9 and 16) while said marginal regions of said at least one underlying layer are covered by said sacrificial layer.

One or more embodiments may include providing said at least one underlying layer as a passivation layer (e.g., 20), preferably having provided thereon a respective barrier layer (e.g., 24).

Figure 19:
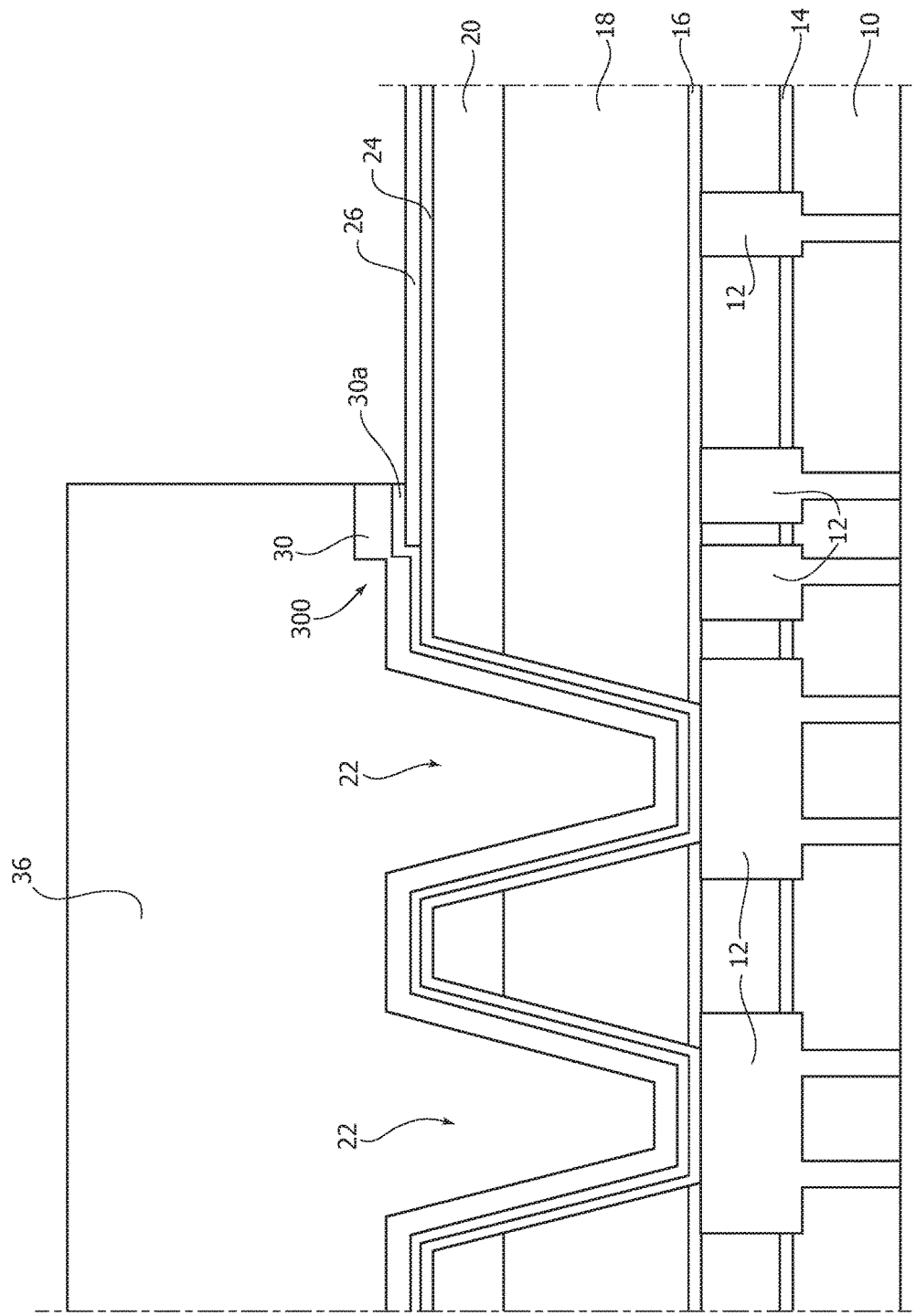
Figure 20:
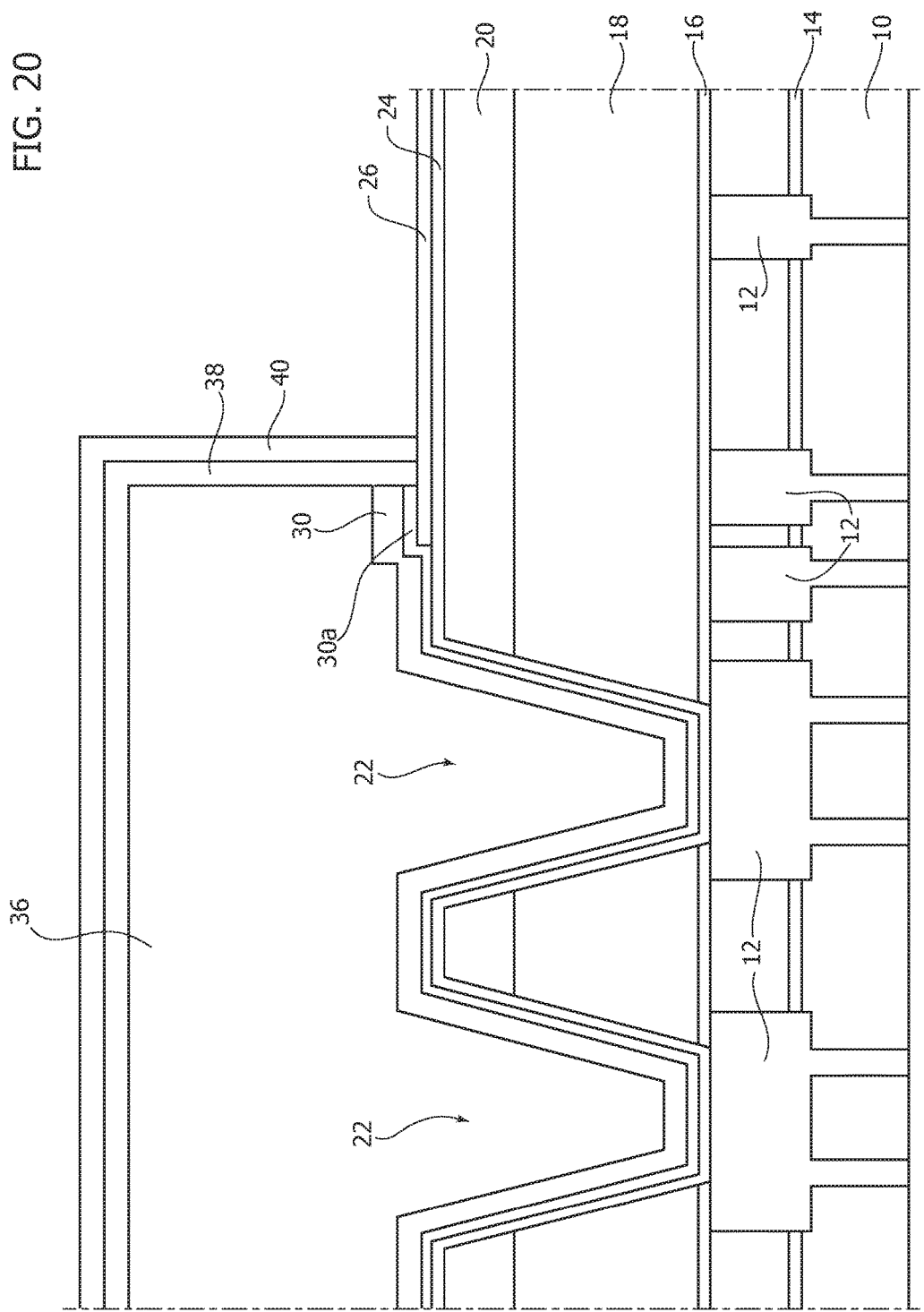

One or more embodiments may include providing said respective barrier layer on said passivation layer as a layer extending underlying said metallization body, with said sacrificial layer provided to cover said respective barrier layer at said marginal regions of said at least one underlying layer (see, e.g., FIGS. 12 and 19).

One or more embodiments may include removing said respective barrier layer from said passivation layer other than at said marginal regions (see, e.g., FIGS. 15 and 22).

In one or more embodiments:
said passivation layer may include a nitride passivation layer, and/or
said respective barrier layer (24) may include a TiW barrier.

In one or more embodiments, said sacrificial layer (e.g., 26) may include silicon nitride.

In one or more embodiments, said metallizations may include Cu-RDL metallizations.

One or more embodiments may provide a semiconductor device including metallizations having peripheral portions with at least one underlying layer having marginal regions extending facing said peripheral portions wherein said marginal regions of said at least one underlying layer extend facing said peripheral portions in the absence of contact interface therebetween.

Without prejudice to the underlying principles, the details and embodiments may vary, even significantly, with respect to what has been disclosed merely by way of example, without departing from the extent of protection.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A semiconductor device, comprising:
a first layer having a via and a marginal region;
metallizations partially extending in the via in the first layer and having peripheral portions facing the marginal region of said first layer without contacting the marginal region and separated from the marginal region by an undercut gap, at least a portion of the metallizations being lower than an upper surface of the first layer; and
a first barrier layer extending in the via and having a peripheral portion extending on the marginal region of the first layer, the peripheral portion of the first barrier layer being separated from the peripheral portions of the metallizations by the undercut gap.

2. The semiconductor device of claim 1, wherein said metallizations include:
a metallization body, and
an outer surface coating on said body, wherein said marginal region faces said peripheral portions without a contact interface with both said metallization body and said outer surface coating.

3. The semiconductor device of claim 2, further comprising a second barrier layer underlying said metallization body and adjoining said outer surface coating, the second barrier layer and outer surface coating together surround said metallization body.

4. The semiconductor device of claim 2, wherein said first layer includes a passivation layer and the first barrier layer extends on the passivation layer.

5. The semiconductor device of claim 4, wherein said first barrier layer extends under said metallization body.

6. The semiconductor device of claim 4, wherein said first barrier layer extends on said passivation layer only at said marginal region.

7. The semiconductor device of claim 4, wherein:
said passivation layer includes a dielectric passivation layer, and/or
said first barrier layer includes titanium tungsten.

8. The semiconductor device of claim 1, wherein said metallizations include Cu-RDL metallizations.

9. A semiconductor device, comprising:
a dielectric layer;
a passivation layer on the dielectric layer, the passivation layer having a marginal region;
a first metallization layer extending in a via through the passivation layer, at least a portion of the first metallization layer being positioned lower than an upper surface of the passivation layer;

a second metallization layer coating a top surface of the first metallization layer and having a peripheral portion coating a side surface of the first metallization layer, the peripheral portion having an end that faces the marginal region of the passivation layer and separated from the marginal region by an undercut gap that extends inward beyond the end; and a first barrier layer extending in the via and on the marginal region of the passivation layer, the first barrier layer being positioned below the first metallization layer and being separated from the end of the peripheral portion of the second metallization by the undercut gap.

10. The semiconductor device of claim 9, further comprising a barrier layer underlying the first metallization layer and adjoining the second metallization layer, the barrier layer and second metallization layer together encapsulating the first metallization layer.

11. The semiconductor device of claim 9, further comprising a third metallization layer coating outside surfaces of the second metallization layer, the third metallization layer having a peripheral portion coating the peripheral portion of the second metallization layer and having an end that faces the marginal region of the passivation layer without contacting the marginal region.

12. The semiconductor device of claim 9, wherein:
the passivation layer extends lengthwise in a first direction;
the peripheral portion of the second metallization layer extends lengthwise in a second direction perpendicular to the first direction and has an end face; and
the end face of the peripheral portion of the second metallization layer faces the marginal region of the passivation layer and is spaced apart from the marginal region by a gap.

13. The semiconductor device of claim 9, further comprising:
a second barrier layer underlying said first metallization layer and contacting the second metallization layer, the second barrier layer and second metallization layer together encapsulating the first metallization layer.

14. A semiconductor device, comprising:
a passivation layer having a marginal region;
a first metallization layer extending in a via through the passivation layer, at least a portion of the first metallization layer being positioned in the via lower than an upper surface of the passivation layer;
a first conductive barrier layer extending in the via, underlying said first metallization layer, and extending on the marginal region of the passivation layer; and
a second conductive barrier layer extending in the via and over the marginal region of the passivation layer between the first metallization and the first conductive barrier layer, the first conductive barrier layer having a first portion positioned in the via and contacting a bottom surface of the first metallization layer and a second portion positioned on the marginal region of the passivation layer and spaced apart from the second barrier layer by an undercut gap.

15. The semiconductor device of claim 14, further comprising a second metallization layer coating a top surface of the first metallization layer and having a peripheral portion coating a side surface of the first metallization layer, the peripheral portion having an end that faces the marginal region of the passivation layer without contacting the marginal region.

16. The semiconductor device of claim 15, wherein the second conductive barrier layer contacts the second metallization layer, the second conductive barrier layer and second metallization layer together encapsulating the first metallization layer.

17. The semiconductor device of claim 15, further comprising a third metallization layer coating outside surfaces of the second metallization layer, the third metallization layer having a peripheral portion coating the peripheral portion of the second metallization layer and having an end that faces the marginal region of the passivation layer without contacting the marginal region.

18. The semiconductor device of claim 15, wherein:
the passivation layer extends lengthwise in a first direction;
the peripheral portion of the second metallization layer extends lengthwise in a second direction perpendicular to the first direction and has an end face; and
the end face of the peripheral portion of the second metallization layer faces the marginal region of the passivation layer and is spaced apart from the marginal region by the gap.

19. The semiconductor device of claim 14, further comprising a third conductive barrier layer having a first portion positioned between and contacting the first and second conductive barrier layers in the via and a second portion positioned between the first and second conductive barrier layers above the marginal region of the passivation layer, the second portion of the third conductive barrier layer being spaced apart from the first conductive barrier layer.

* * * * *